(12) United States Patent
Cai et al.

(10) Patent No.: US 10,996,291 B2
(45) Date of Patent: May 4, 2021

(54) MAGNETISM DETECTION DEVICE

(71) Applicant: TDK Corporation, Tokyo (JP)

(72) Inventors: Yongfu Cai, Tokyo (JP); Toshihide Suto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 140 days.

(21) Appl. No.: 16/356,210

(22) Filed: Mar. 18, 2019

(65) Prior Publication Data

US 2019/0285709 A1     Sep. 19, 2019

(30) Foreign Application Priority Data

Mar. 19, 2018 (JP) .............................. JP2018-051264

(51) Int. Cl.
   *G01R 33/09*     (2006.01)
   *G01R 33/00*     (2006.01)

(52) U.S. Cl.
   CPC ....... *G01R 33/093* (2013.01); *G01R 33/0029* (2013.01); *G01R 33/091* (2013.01); *G01R 33/098* (2013.01)

(58) Field of Classification Search
   CPC ................ G01R 33/00; G01R 33/0029; G01R 33/0094; G01R 33/02; G01R 33/06; G01R 33/07; G01R 33/09; G01R 33/091; G01R 33/093; G01R 33/098
   USPC .... 324/200, 207.11, 207.12, 207.13, 207.15, 324/207.16, 207.19, 207.2, 207.21
   See application file for complete search history.

(56) References Cited

U.S. PATENT DOCUMENTS

| | | | |
|---|---|---|---|
| 5,695,858 A | 12/1997 | Maeda et al. | |
| 7,558,027 B2 * | 7/2009 | Hirata | B82Y 10/00 360/319 |
| 7,592,805 B2 | 9/2009 | Ando et al. | |
| 8,466,676 B2 | 6/2013 | Saruki et al. | |
| 8,487,611 B2 | 7/2013 | Saruki et al. | |
| 9,664,768 B2 | 5/2017 | Furuichi et al. | |
| 2011/0019466 A1 * | 1/2011 | Wang | G11C 11/1675 365/158 |
| 2011/0025319 A1 * | 2/2011 | Saruki | G01R 33/0029 324/252 |

(Continued)

FOREIGN PATENT DOCUMENTS

| | | |
|---|---|---|
| JP | H07-312449 A | 11/1995 |
| JP | 2008-058183 A | 3/2008 |
| JP | 2011-027683 A | 2/2011 |

(Continued)

OTHER PUBLICATIONS

Aug. 11, 2020 Office Action issued in Japanese Patent Application No. 2018-051264.

(Continued)

*Primary Examiner* — Hoai-An D. Nguyen
(74) *Attorney, Agent, or Firm* — Oliff PLC

(57) ABSTRACT

A magnetism detection device according to an embodiment of the disclosure includes a sensor section and a resistive section. The sensor section includes a first magnetism detection element. The first magnetism detection element has a first stacked structure and is configured to detect a magnetic field to be detected. The resistive section includes a first resistive element and is coupled to the sensor section. The first resistive element has the first stacked structure.

27 Claims, 6 Drawing Sheets

(56) References Cited

U.S. PATENT DOCUMENTS

| | | | |
|---|---|---|---|
| 2014/0138346 A1* | 5/2014 | Whig | H01L 43/08 216/19 |
| 2015/0108972 A1* | 4/2015 | Zimmer | G11B 5/3961 324/252 |

FOREIGN PATENT DOCUMENTS

| | | |
|---|---|---|
| JP | 2011-033456 A | 2/2011 |
| JP | 2013-242299 A | 12/2013 |

OTHER PUBLICATIONS

Jan. 5, 2021 Office Action issued in Japanese Patent Application No. 2018-051264.

* cited by examiner

MAGNETISM DETECTION DEVICE

CROSS REFERENCE TO RELATED APPLICATIONS

This application claims the benefit of Japanese Priority Patent Application No. 2018-051264 filed on Mar. 19, 2018, the entire contents of which are incorporated herein by reference.

BACKGROUND

The disclosure relates to a magnetism detection device provided with a magnetism detection element and a resistive element.

The Applicant of the present application has proposed a magnetic sensor provided with a circuit in which a plurality of magneto-resistive effect elements are coupled in series to a compensation resistor. The plurality of magneto-resistive effect elements constitute a bridge circuit. For example, reference is made to Japanese Unexamined Patent Application Publication No. 2011-33456.

SUMMARY

A magnetism detection device according to one embodiment of the disclosure includes a sensor section and a resistive section. The sensor section includes a first magnetism detection element. The first magnetism detection element has a first stacked structure and is configured to detect a magnetic field to be detected. The resistive section includes a first resistive element and is coupled to the sensor section. The first resistive element has the first stacked structure.

A magnetism detection device according to one embodiment of the disclosure includes a sensor section and a resistive section. The sensor section includes a first magnetism detection element. The first magnetism detection element includes a first magnetic body and is configured to detect a magnetic field to be detected. The first magnetic body has first magnetization pinned in a first direction. The resistive section includes a first resistive element and is coupled to the sensor section. The first resistive element includes a second magnetic body having second magnetization pinned in the first direction.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
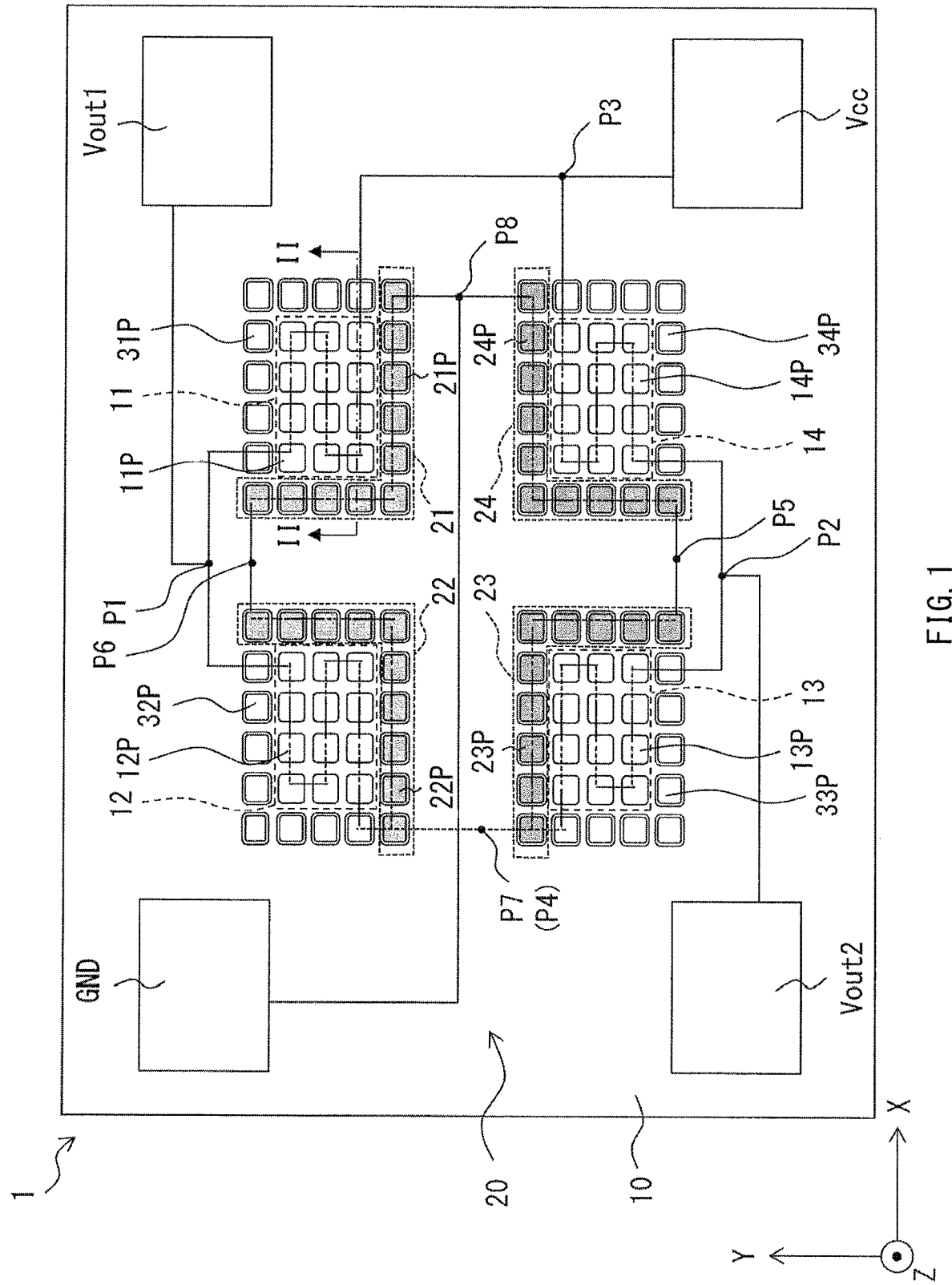
FIG. 1 is a plan view of an overall configuration example of a magnetism detection device according to one embodiment of the disclosure.

Some embodiments of the disclosure are described below in detail with reference to the accompanying drawings.

Incidentally, it has been requested to improve productivity of a magnetism detection device provided with such a compensation resistor.

It is desirable to provide a magnetism detection device having a structure that is able to be manufactured by simpler processes.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. Example Embodiment

An example of a magnetism detection device including a bridge circuit that includes four magnetism detection elements and a bridge circuit that includes four resistive elements.

2. Modification Examples

Examples such as an example of a magnetism detection device further including dummy parts that are arranged among a plurality of magnetism detection elements in a sensor section.

3. Other Modification Examples

1. Example Embodiment

[Configuration of Magnetism Detection Device 1]

Figure 2:
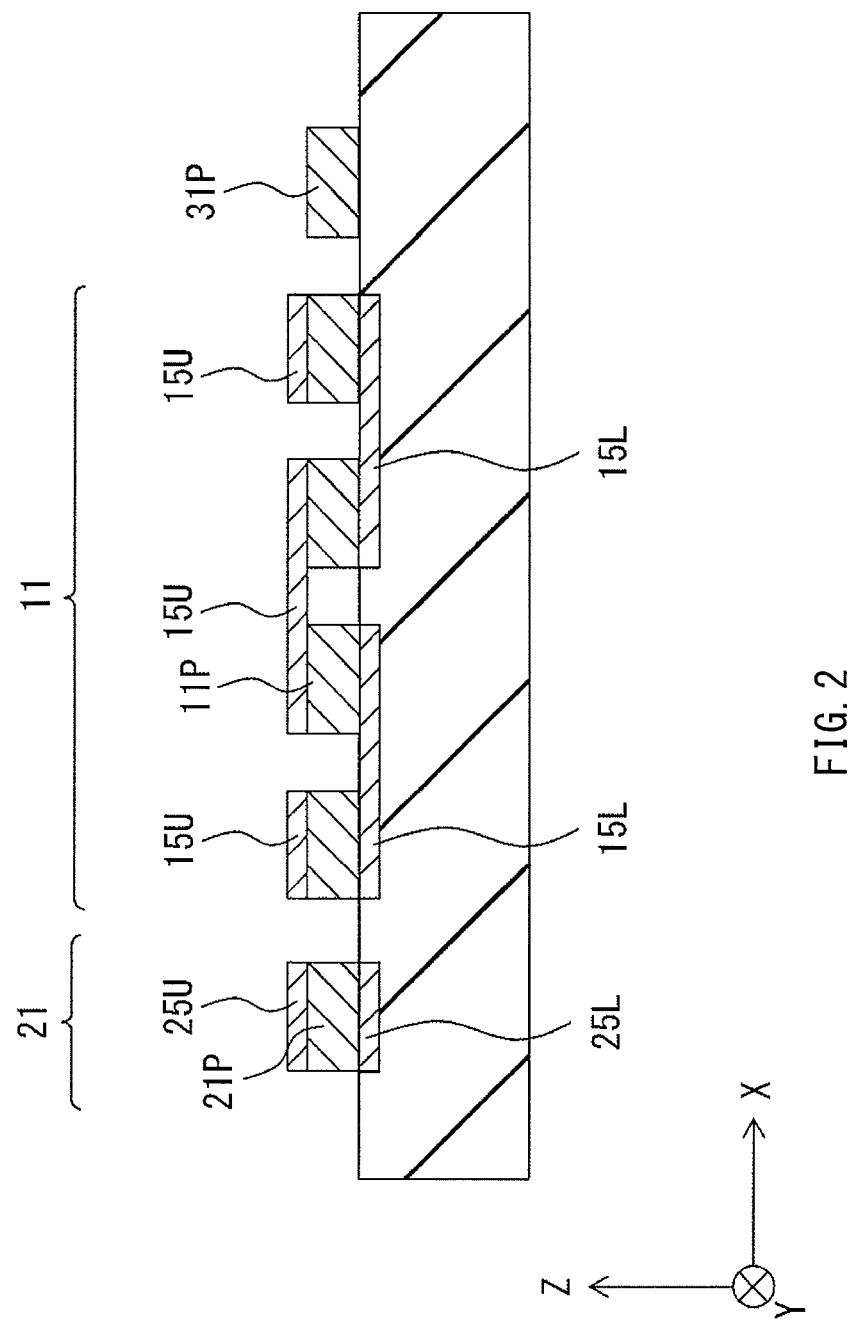
FIG. 2 is a cross-sectional view of a cross-sectional configuration of the magnetism detection device illustrated in FIG. 1.
Figure 3:
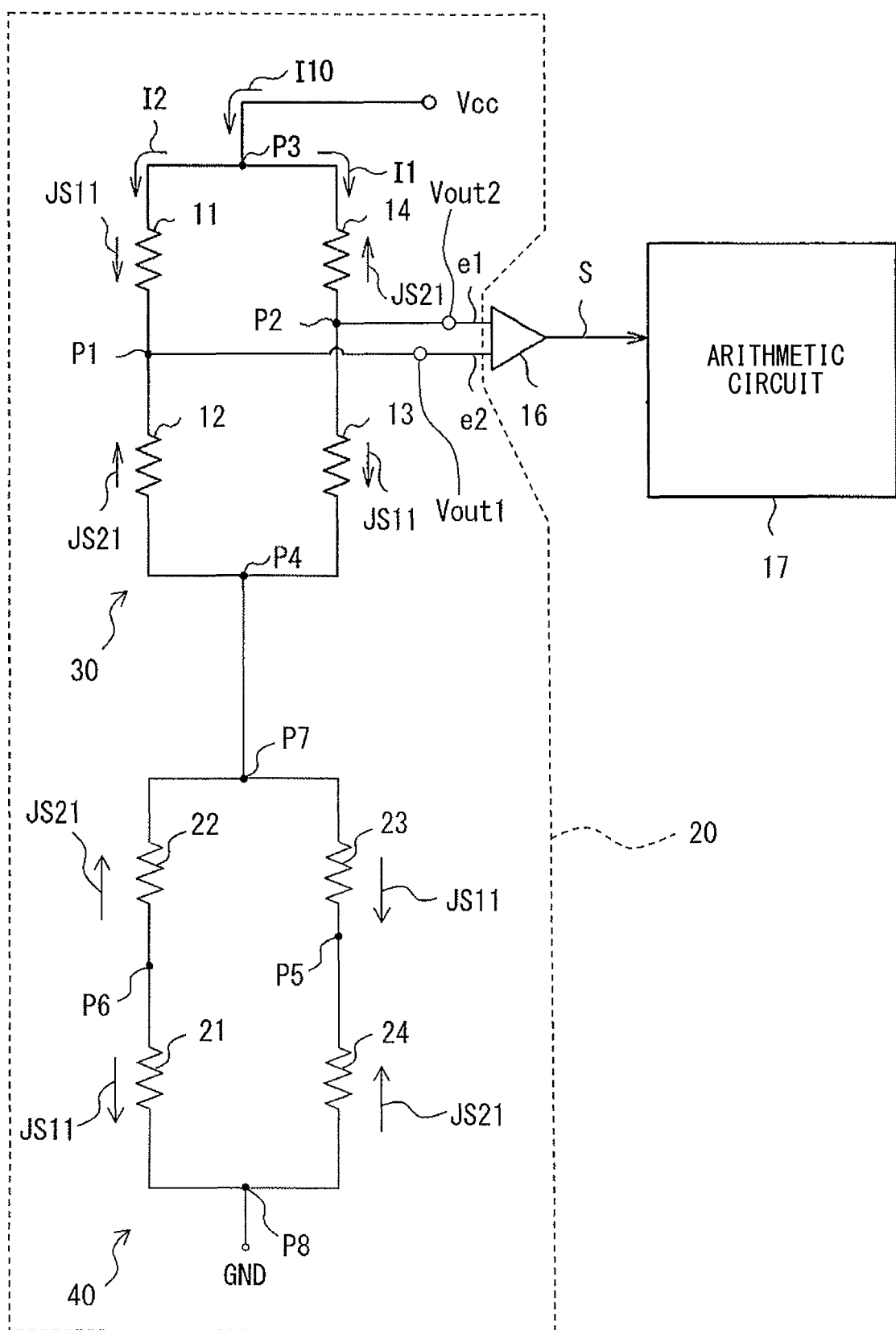
FIG. 3 is a circuit diagram of the magnetism detection device illustrated in FIG. 1.

First, a description is given, with reference to FIGS. 1 to 3, of a configuration of a magnetism detection device 1 according to one embodiment of the disclosure. FIG. 1 is a plan view of an overall configuration example of the magnetism detection device 1. FIG. 2 is a cross-sectional view of a cross-sectional configuration example of the magnetism detection device 1 as viewed in an arrow direction along a cutting line II-II illustrated in FIG. 1. FIG. 3 is a circuit diagram illustrating a schematic configuration of a later-described detection circuit 20 in the magnetism detection device 1. This magnetism detection device 1 may be used as, for example, an angle detection sensor that is used to detect a rotation angle of a rotor.

The magnetism detection device 1 may include a substrate 10 and a detection circuit 20. The detection circuit 20 may be provided on a surface 10S of the substrate 10. The detection circuit 20 may include a bridge circuit 30 and a bridge circuit 40. The bridge circuit 30 is a specific but non-limiting example corresponding to a "sensor section" in one embodiment of the disclosure, and the bridge circuit 40 is a specific but non-limiting example corresponding to a "resistive section" in one embodiment of the disclosure.

[Bridge Circuit 30]

As illustrated in FIG. 3, the bridge circuit 30 may include four bridged magnetism detection elements 11 to 14, for example. Each of the magnetism detection elements 11 to 14 may be a magneto-resistive effect (MR) element, for example. Each of the magnetism detection elements 11 to 14 is able to detect a variation in an external magnetic field H to be detected. The "variation in an external magnetic field H" as used herein means that this variation may include a variation in magnitude of the external magnetic field H, or a variation in an angle or an orientation of the external magnetic field H.

Figure 4A:
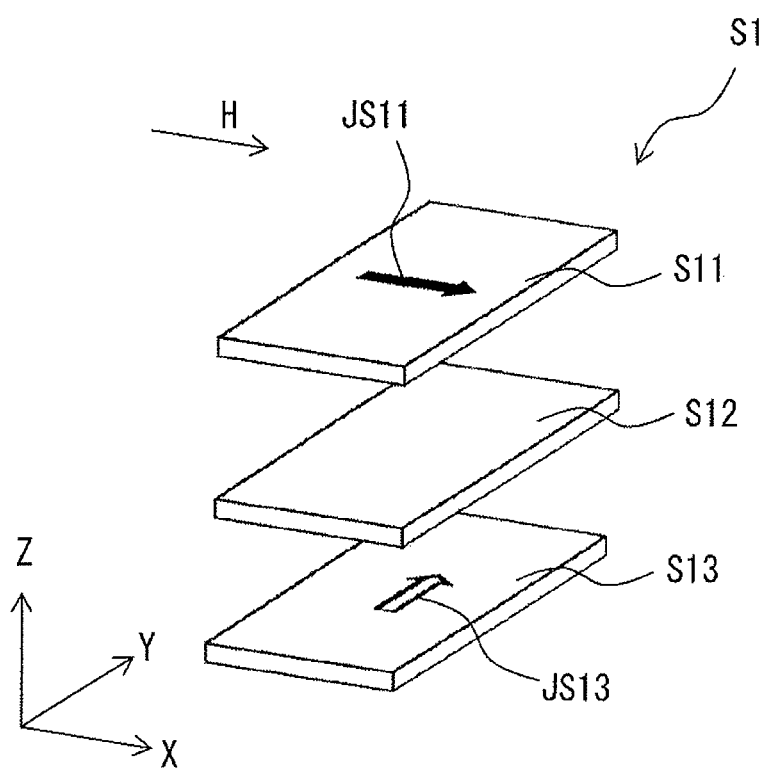
FIG. 4A is a perspective view of a first stacked structure of a magnetism detection element illustrated in FIG. 1.
Figure 4B:
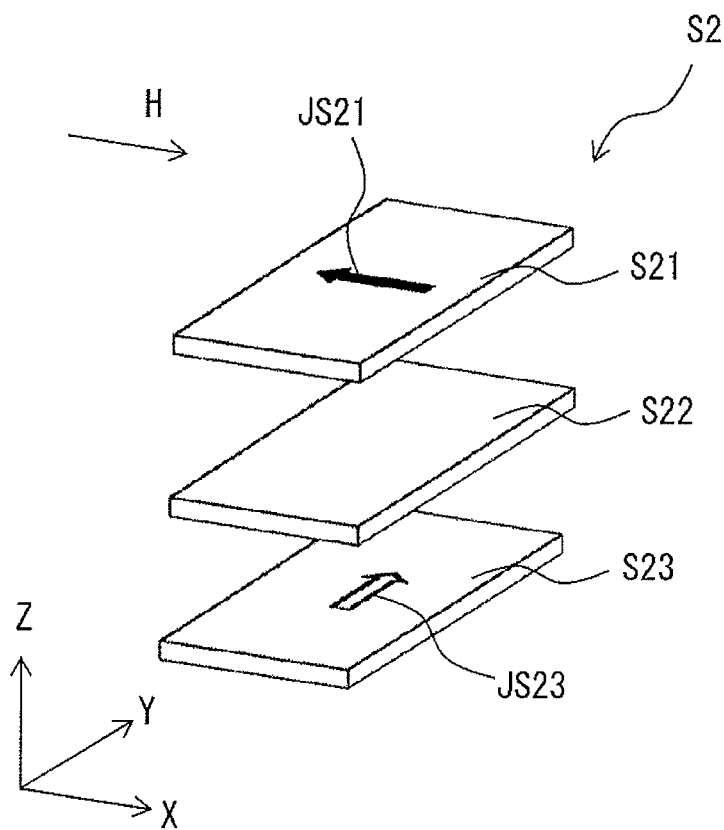
FIG. 4B is a perspective view of a second stacked structure of the magnetism detection element illustrated in FIG. 1.

Here, each of the magnetism detection elements 11 and 13 has a first stacked structure S1 illustrated in FIG. 4A, while each of the magnetism detection elements 12 and 14 may have a second stacked structure S2 illustrated in FIG. 4B. Thus, the magnetism detection elements 11 and 13, and the magnetism detection elements 12 and 14 may output respective signals depending on the variation in the external magnetic field H. Phases of the respective signals may be different from each other by 180°, for example. The first stacked structure S1 and the second stacked structure S2 are described below in detail. It is to be noted that FIGS. 4A and 4B are exploded perspective views respectively illustrating schematic configurations of the first stacked structure S1 and the second stacked structure S2.

As illustrated in figures such as FIG. 1, the four magnetism detection elements 11 to 14 constituting the bridge circuit 30 may be provided on the same substrate 10. The bridge circuit 30 may be coupled to a differential detector 16 illustrated in FIG. 3, for example. The differential detector 16 may be provided on the substrate 10, for example. In an alternative embodiment, the differential detector 16 may be provided outside the magnetism detection device 1.

As illustrated in FIG. 3, the bridge circuit 30 may have a configuration in which the magnetism detection element 11 and the magnetism detection element 12 coupled in series and the magnetism detection element 13 and the magnetism detection element 14 coupled in series are coupled in parallel to each other. In a more specific but non-limiting example, in the bridge circuit 30, one end of the magnetism detection element 11 and one end of the magnetism detection element 12 may be coupled at a node P1; one end of the magnetism detection element 13 and one end of the magnetism detection element 14 may be coupled at a node P2; the other end of the magnetism detection element 11 and the other end of the magnetism detection element 14 may be coupled at a node P3; and the other end of the magnetism detection element 12 and the other end of the magnetism detection element 13 may be coupled at a node P4. Here, the node P3 may be coupled to a power supply terminal Vcc, and the node P4 may be coupled to a ground terminal GND via the bridge circuit 40. The node P1 may be coupled to an output terminal Vout1, and the node P2 may be coupled to an output terminal Vout2. Each of the output terminal Vout1 and the output terminal Vout2 may be coupled to an input-side terminal of the differential detector 16, for example. This differential detector 16 may detect a potential difference between the node P1 and the node P2 at a time when a voltage is applied between the node P3 and the node P4, and output the detected potential difference to an arithmetic circuit 17 as a differential signal S. The potential difference between the node P1 and the node P2 is a difference between voltage drops that are respectively generated in the magnetism detection element 11 and the magnetism detection element 14.

It is to be noted that, in FIG. 3, an arrow to which a reference numeral JS11 is attached schematically denotes an orientation of magnetization JS11 illustrated in FIG. 4A of a magnetization pinned layer S11 illustrated in FIG. 4A in each of the magnetism detection elements 11 and 13. Further, in FIG. 3, an arrow to which a reference numeral JS21 is attached schematically denotes an orientation of magnetization JS21 illustrated in FIG. 4B of a magnetization pinned layer S21 illustrated in FIG. 4B in each of the magnetism detection elements 12 and 14. As illustrated in FIG. 3, the orientation of the magnetization JS11 and the orientation of the magnetization JS21 are opposite to each other. In other words, FIG. 3 illustrates that a resistive value of the magnetism detection element 11 and a resistive value of the magnetism detection element 13 vary, e.g., increase or decrease in the same orientation as each other depending on the variation in the external magnetic field H. Further, FIG. 3 also illustrates that both a resistive value of the magnetism detection element 12 and a resistive value of the magnetism detection element 14 vary, i.e., decrease or increase in an orientation opposite to those of the variations in the respective resistive values of the magnetism detection elements 11 and 13 depending on the variation in the external magnetic field H.

As illustrated in FIG. 1, the magnetism detection element 11 may include a plurality of first sensor patterns 11P; the magnetism detection element 12 may include a plurality of second sensor patterns 12P; the magnetism detection element 13 may include a plurality of third sensor patterns 13P; and the magnetism detection element 14 may include a plurality of fourth sensor patterns 14P. Here, each of the plurality of first sensor patterns 11P and the plurality of third sensor patterns 13P may have the first stacked structure S1 illustrated in FIG. 4A. Meanwhile, each of the plurality of second sensor patterns 12P and the plurality of fourth sensor patterns 14P may have the second stacked structure S2 illustrated in FIG. 4B. As illustrated in FIG. 1, each of the plurality of first to fourth sensor patterns 11P to 14P may be arranged on the substrate 10 in matrix, for example. It is to be noted that FIG. 1 exemplifies that each of the plurality of first to fourth sensor patterns 11P to 14P is arranged to allow four sensor patterns to be lined in an X-axis direction and to allow three sensor patterns to be lined in a Y-axis direction. However, any other arrangement may be adopted in one embodiment of the disclosure. Further, the number of each of the plurality of first to fourth sensor patterns 11P to 14P in the magnetism detection elements 11 to 14 may be the same as each other, or may be different from each other. In the magnetism detection element 11, the plurality of first sensor patterns 11P may be coupled in series to each other. As illustrated in FIG. 2, upper surfaces of two adjacent first sensor patterns 11P may be coupled, for example, by wiring 15U, or lower surfaces thereof may be coupled by wiring 15L. Similarly, in the magnetism detection element 12, the plurality of second sensor patterns 12P may be coupled in series to each other. In the magnetism detection element 13, the plurality of third sensor patterns 13P may be coupled in series to each other. In the magnetism detection element 14, the plurality of fourth sensor patterns 14P may be coupled in series to each other.

It is to be noted that a plurality of first to fourth dummy patterns 31P to 34P may further be formed in the magnetism detection device 1. The plurality of first dummy patterns 31P may be arranged to enclose at least a part of the plurality of first sensor patterns 11P in the magnetism detection element 11. The plurality of second dummy patterns 32P may be arranged to enclose at least a part of the plurality of second sensor patterns 12P in the magnetism detection element 12. The plurality of third dummy patterns 33P may be arranged to enclose at least a part of the plurality of third sensor patterns 13P in the magnetism detection element 13. The plurality of fourth dummy patterns 34P may be arranged to enclose at least a part of the plurality of fourth sensor patterns 14P in the magnetism detection element 14.

As illustrated in FIG. 4A and FIG. 4B, each of the first stacked structure S1 and the second stacked structure S2 may have a spin valve structure in which a plurality of function films including a magnetic layer is stacked. In a specific but non-limiting example, as illustrated in FIG. 4A, the first stacked structure S1 may have a configuration in which the magnetization pinned layer S11, an intermediate layer S12, and a magnetization free layer S13 are stacked in order in a Z-axis direction. The magnetization pinned layer S11 has magnetization JS11 pinned in a +X direction. The intermediate layer S12 does not exhibit a specific magnetization direction. The magnetization free layer S13 has magnetization JS13 that varies depending on magnetic flux density of the external magnetic field H. Each of the magnetization pinned layer S11, the intermediate layer S12, and the magnetization free layer S13 may be a thin film that extends in an XY plane. Accordingly, an orientation of the magnetization JS13 on the magnetization free layer S13 may be rotatable in the XY plane. It is to be noted that FIG. 4A illustrates a load state in which the external magnetic field H is applied in the orientation of the magnetization JS13.

As illustrated in FIG. 4B, the second stacked structure S2 may have a configuration in which the magnetization pinned layer S21, an intermediate layer S22, and a magnetization free layer S23 are stacked in order in the Z-axis direction. The magnetization pinned layer S21 has magnetization JS21 pinned in a −X direction. The intermediate layer S22 does not exhibit a specific magnetization direction. The magnetization free layer S23 has magnetization JS23 that varies depending on the magnetic flux density of the external magnetic field H. Each of the magnetization pinned layer S21, the intermediate layer S22, and the magnetization free layer S23 may be a thin film that extends in the XY plane. Accordingly, an orientation of the magnetization JS23 on the magnetization free layer S23 may be rotatable in the XY plane. It is to be noted that FIG. 4B illustrates a load state in which the external magnetic field H is applied in the orientation of the magnetization JS23.

Thus, the magnetization pinned layer S11 in the first stacked structure S1 may have the magnetization JS11 pinned in the +X direction, while the magnetization pinned layer S21 in the second stacked structure S2 may have the magnetization JS21 pinned in the −X direction. It is to be noted that the magnetization JS11 is a specific but non-limiting example corresponding to a "first magnetization" in one embodiment of the disclosure, and the magnetization pinned layer S11 is a specific but non-limiting example corresponding to a "first ferromagnetic layer" in one embodiment of the disclosure. Further, the magnetization JS21 is a specific but non-limiting example corresponding to a "second magnetization" in one embodiment of the disclosure, and the magnetization pinned layer S21 is a specific but non-limiting example corresponding to a "second ferromagnetic layer" in one embodiment of the disclosure.

It is to be noted that each of the magnetization pinned layers S11 and S21, the intermediate layers S12 and S22, and the magnetization free layers S13 and S23 in the first stacked structure S1 and the second stacked structure S2 may have a single-layer structure or a multi-layer structure configured by a plurality of layers. Further, in the first stacked structure S1, the magnetization pinned layer S11, the intermediate layer S12, and the magnetization free layer S13 may be stacked in an order reverse to that of the above. Similarly, in the second stacked structure S2, the magnetization pinned layer S21, the intermediate layer S22, and the magnetization free layer S23 may be stacked in an order reverse to that of the above.

The magnetization pinned layer S11 and the magnetization pinned layer S21 may be formed by substantially the same material as each other. Each of the magnetization pinned layer S11 and the magnetization pinned layer S21 may include, for example, a ferromagnetic material such as cobalt (Co), a cobalt-iron alloy (CoFe), or a cobalt-iron-boron alloy (CoFeB). It is to be noted that an unillustrated antiferromagnetic layer may be provided on side opposite to the intermediate layer S12 to be adjacent to the magnetization pinned layer S11 in the first stacked structure S1. Similarly, an unillustrated antiferromagnetic layer may be provided on side opposite to the intermediate layer S22 to be adjacent to the magnetization pinned layer S21 in the second stacked structure S2. Such an antiferromagnetic layer may be configured by an antiferromagnetic material such as a platinum-manganese alloy (PtMn) or an iridium-manganese alloy (IrMn). In the first stacked structure S1 and the second stacked structure S2, the antiferromagnetic layer is in a state in which a spin magnetic moment in the +X direction and a spin magnetic moment in the −X direction completely cancel each other, and serves to fix the orientation of the magnetization JS11 on the adjacent magnetization pinned layer S11 to the +X direction, or to fix the orientation of the magnetization JS21 on the adjacent magnetization pinned layer S21 to the −X direction.

The intermediate layer S12 and the intermediate layer S22 may be formed by substantially the same material as each other. In a case where the spin valve structure serves as a magnetic tunnel junction (MTJ) film, the intermediate layer S12 and the intermediate layer S22 may be a non-magnetic tunnel barrier layer including a magnesium oxide (MgO), for example. Each of the intermediate layers S12 and S22 may be thin enough to enable a tunnel current based on quantum mechanics to pass therethrough. The tunnel barrier layer including MgO may be obtained by a process such as a process of oxidizing a thin film including magnesium (Mg) and a reactive sputtering process in which sputtering of magnesium is performed under an oxygen atmosphere, besides a sputtering process that uses a target including MgO, for example. It is also possible to configure each of the intermediate layers S12 and S22 with use of an oxide or a nitride of each of aluminum (Al), tantalum (Ta), and hafnium (Hf), besides MgO. It is to be noted that the intermediate layer S12 and the intermediate layer S22 may be configured by a platinum group element such as ruthenium (Ru), or a non-magnetic metal such as gold (Au) and copper (Cu), for example. In such a case, the spin valve structure may serve as a giant magneto resistive effect (GMR) film.

Each of the magnetization free layer S13 and the magnetization free layer S23 may be a soft ferromagnetic layer, and may be formed by substantially the same material as each other. Each of the magnetization free layer S13 and the magnetization free layer S23 may be configured by, for example, a material such as a cobalt-iron alloy (CoFe), a nickel-iron alloy (NiFe), or a cobalt-iron-boron alloy (CoFeB).

Current I10 from the power supply terminal Vcc may split into current I1 and current I2 at the node P3. The current I1 or the current I2 may be supplied to each of the magnetism detection elements 11 to 14 constituting the bridge circuit 30. Signals e1 and e2 may respectively be extracted from the nodes P2 and P1 of the bridge circuit 30. The signals e1 and e2 may flow into the differential detector 16. Here, when an angle formed by the magnetization JS21 and the magnetization JS23 is defined as γ, for example, the signal e1 denotes an output variation that varies in accordance with A×cos(+γ)+B (each of A and B is a constant), and the signal e2 denotes an output variation that varies in accordance with A×cos(γ−180°+B.

[Bridge Circuit 40]

As illustrated in FIG. 3, the bridge circuit 40 may include four bridged resistive elements 21 to 24, for example. Each of the resistive elements 21 to 24 may be a magneto-resistive effect element similarly to the magnetism detection elements 11 to 14. Accordingly, a resistive value of each of the resistive elements 21 to 24 varies depending on the variation in the external magnetic field H. Here, each of the resistive elements 21 and 23 has the first stacked structure S1 illustrated in FIG. 4A, while each of the resistive elements 22 and 24 may have the second stacked structure S2 illustrated in FIG. 4B. Thus, a resistive value between a node P7 and a node P8 is maintained substantially constant regardless of the variation in the external magnetic field H. Hence, the bridge circuit 40 may serve as a resistor element for output correction. The resistor element may adjust an output voltage depending on the application thereof regardless of fluctuation in the external magnetic field H.

The four resistive elements 21 to 24 constituting the bridge circuit 40 may be provided on substrate 10 the same as the magnetism detection elements 11 to 14.

As illustrated in FIG. 3, the bridge circuit 40 may have a configuration in which the resistive element 21 and the resistive element 22 coupled in series and the resistive element 23 and the resistive element 24 coupled in series are coupled in parallel to each other. In a more specific but non-limiting example, in the bridge circuit 40, one end of the resistive element 21 and one end of the resistive element 22 may be coupled at a node P6; one end of the resistive element 23 and one end of the resistive element 24 may be coupled at a node P5; the other end of the resistive element 21 and the other end of the resistive element 24 may be coupled at the node P8; and the other end of the resistive element 22 and the other end of the resistive element 23 may be coupled at the node P7. Here, the node P7 may be coupled to the node P4 of the bridge circuit 30 via wiring, and the node P8 may be coupled to the ground terminal GND.

It is to be noted that, in FIG. 3, an arrow to which the reference numeral JS11 is attached schematically denotes the orientation of magnetization JS11 illustrated in FIG. 4A of the magnetization pinned layer S11 illustrated in FIG. 4A in each of the resistive elements 21 and 23. Further, in FIG. 3, an arrow to which the reference numeral JS21 is attached schematically denotes the orientation of magnetization JS21 illustrated in FIG. 4B of the magnetization pinned layer S21 illustrated in FIG. 4B in each of the resistive elements 22 and 24. As illustrated in FIG. 3, the orientation of the magnetization JS11 and the orientation of the magnetization JS21 are opposite to each other. In other words, FIG. 3 illustrates that a resistive value of the resistive element 21 and a resistive value of the resistive element 23 vary, e.g., increase or decrease in the same orientation as each other depending on the variation in the external magnetic field H. Further, FIG. 3 illustrates that both a resistive value of the resistive element 22 and a resistive value of the resistive element 24 vary, i.e., decrease or increase in an orientation opposite to those of the variations in the respective resistive values of the magnetism detection elements 21 and 23 depending on the variation in the external magnetic field H.

As illustrated in FIG. 1, the resistive element 21 may include a plurality of first resistance patterns 21P; the resistive element 22 may include a plurality of second resistance patterns 22P; the resistive element 23 may include a plurality of third resistance patterns 23P; and the resistive element 24 may include a plurality of fourth resistance patterns 24P. Here, each of the plurality of first resistance patterns 21P and the plurality of third resistance patterns 23P may have the first stacked structure S1 illustrated in FIG. 4A. Meanwhile, each of the plurality of second resistance patterns 22P and the plurality of fourth resistance patterns 24P may have the second stacked structure S2 illustrated in FIG. 4B.

As illustrated in FIG. 1, the plurality of first resistance patterns 21P may be arranged to enclose at least a part of the plurality of first sensor patterns 11P in the magnetism detection element 11. The plurality of second resistance patterns 22P may be arranged to enclose at least a part of the plurality of second sensor patterns 12P in the magnetism detection element 12. The plurality of third resistance patterns 23P may be arranged to enclose at least a part of the plurality of third sensor patterns 13P in the magnetism detection element 13. The plurality of fourth resistance patterns 24P may be arranged to enclose at least a part of the plurality of fourth sensor patterns 14P in the magnetism detection element 14. It is to be noted that the plurality of first resistance patterns 21P in the resistive element 21 may be provided, on the substrate 10, in a region between the magnetism detection element 11 and the magnetism detection element 14 or a region between the magnetism detection element 11 and the magnetism detection element 12. The plurality of second resistance patterns 22P in the resistive element 22 may be provided, on the substrate 10, in a region between the magnetism detection element 12 and the magnetism detection element 11 or a region between the magnetism detection element 12 and the magnetism detection element 13. The plurality of third resistance patterns 23P in the resistive element 23 may be provided, on the substrate 10, in a region between the magnetism detection element 13 and the magnetism detection element 12 or a region between the magnetism detection element 13 and the magnetism detection element 14. Moreover, the plurality of fourth resistance patterns 24P in the resistive element 24 may be provided, on the substrate 10, in a region between the magnetism detection element 14 and the magnetism detection element 13 or a region between the magnetism detection element 14 and the magnetism detection element 11.

In the resistive element 21, the plurality of first resistance patterns 21P may be coupled in series to each other. As illustrated in FIG. 2, upper surfaces of two adjacent first resistance patterns 21P may be coupled, for example, by wiring 25U, or lower surfaces thereof may be coupled by wiring 25L. Similarly, in the resistive element 22, the plurality of second resistance patterns 22P may be coupled in series to each other. In the resistive element 23, the plurality of third resistance patterns 23P may be coupled in series to each other. In the resistive element 24, the plurality of fourth resistance patterns 24P may be coupled in series to each other.

It is to be noted that, in one embodiment of the disclosure, one or more of the plurality of first dummy patterns 31P may be used as the plurality of first resistance patterns 21P. Similarly, in one embodiment of the disclosure, one or more of the plurality of second dummy patterns 32P may be used as the plurality of second resistance patterns 22P; one or more of the plurality of third dummy patterns 33P may be used as the plurality of third resistance patterns 23P; and one or more of the plurality of fourth dummy patterns 34P may be used as the plurality of fourth resistance patterns 24P.

[Operations and Workings of Magnetism Detection Device 1]

In the magnetism detection device 1 according to the present embodiment, for example, it is possible to detect magnitude of a rotation angle θ of the external magnetic field H in the XY plane by the detection circuit 20.

In this magnetism detection device 1, when the external magnetic field H is rotated with respect to the detection circuit 20, a variation in a magnetic-field component, which reaches the detection circuit 20, in the X-axis direction and a variation in the magnetic-field component in the Y-axis direction may be detected by the magnetism detection elements 11 to 14 in the bridge circuit 30. At that time, the differential signal S based on the signal e1 and the signal e2 from the differential detector 16 may flow into the arithmetic circuit 17 as an output from the bridge circuit 30. Thereafter, it is possible to determine the rotation angle θ of the external magnetic field H in the arithmetic circuit 17.

[Effects of Magnetism Detection Device 1]

This magnetism detection device 1 may have a structure that is able to be manufactured by simpler processes.

In a specific but non-limiting example, for example, each of the magnetism detection element 11, the resistive element 21, the magnetism detection element 13, and the resistive element 23 may have the first stacked structure S1 in common. In other words, among the first stacked structure S1 of the magnetism detection element 11, the first stacked structure S1 of the resistive element 21, the first stacked structure S1 of the magnetism detection element 13, and the first stacked structure S1 of the resistive element 23, stacking order of a plurality of stacked films constituting each of them and a constituent material of each of the plurality of stacked films are the same as each other. Accordingly, it is possible to form the magnetism detection element 11, the resistive element 21, the magnetism detection element 13, and the resistive element 23 in a lump by a series of processes. Meanwhile, each of the magnetism detection element 12, the resistive element 22, the magnetism detection element 14, and the resistive element 24 may have the second stacked structure S2 in common. In other words, among the second stacked structure S2 of the magnetism detection element 12, the second stacked structure S2 of the resistive element 22, the second stacked structure S2 of the magnetism detection element 14, and the second stacked structure S2 of the resistive element 24, stacking order of a plurality of stacked films constituting each of them and a constituent material of each of the plurality of stacked films are the same as each other. Accordingly, it is possible to form the magnetism detection element 12, the resistive element 22, the magnetism detection element 14, and the resistive element 24 in a lump by a series of processes. Hence, it is possible to manufacture the magnetism detection device 1 more conveniently as compared with a case where different constituent materials are used for the magnetism detection element and the resistive element or a case where the magnetism detection element and the resistive element have different stacked structures from each other.

Moreover, the magnetization pinned layer S11 of each of the first stacked structure S1 of the magnetism detection element 11, the first stacked structure S1 of the resistive element 21, the first stacked structure S1 of the magnetism detection element 13, and the first stacked structure S1 of the resistive element 23 may have the magnetization JS11 pinned in the +X direction. Accordingly, it is possible to perform, in a lump by the same process, a pinning process for the magnetization JS11 of the magnetization pinned layer S11 in each of the first stacked structure S1 of the magnetism detection element 11, the first stacked structure S1 of the resistive element 21, the first stacked structure S1 of the magnetism detection element 13, and the first stacked structure S1 of the resistive element 23.

Similarly, the magnetization pinned layer S21 of each of the second stacked structure S2 of the magnetism detection element 12, the second stacked structure S2 of the resistive element 22, the second stacked structure S2 of the magnetism detection element 14, and the second stacked structure S2 of the resistive element 24 may have the magnetization JS21 pinned in the −X direction. Accordingly, it is possible to perform, in a lump by the same process, a pinning process for the magnetization JS21 of the magnetization pinned layer S21 in each of the second stacked structure S2 of the magnetism detection element 12, the second stacked structure S2 of the resistive element 22, the second stacked structure S2 of the magnetism detection element 14, and the second stacked structure S2 of the resistive element 24.

Further, in the present embodiment, for example, the first resistance patterns 21P and the first dummy patterns 31P are designed to be provided to enclose the plurality of first sensor patterns 11P. Thus, by forming the plurality of first sensor patterns 11P, the first resistance patterns 21P, and the first dummy patterns 31P in a lump, it is possible to sufficiently reduce dispersion of film quality or a film thickness in the plurality of first sensor patterns 11P. The similar effects are expectable also for the second to fourth sensor patterns 12P to 14P.

Further, in the present embodiment, the resistive elements 21 to 24 are designed to be respectively arranged, on the substrate 10, in regions of gaps among the four magnetism detection elements 11 to 14 arranged in matrix. Thus, for example, in a case where the first to fourth sensor patterns 11P to 14P are formed by utilizing a photolithography method, it is possible to effectively utilize the gap among the four magnetism detection elements 11 to 14. The gap may be generated by limit of exposure in the photolithography method. In other words, it is possible to practically use, as the first to fourth resistance patterns 21P to 24P, the first stacked structure S1 or the second stacked structure S2 with film quality unavailable as the first to fourth sensor patterns 11P to 14P for detection of the external magnetic field H. This makes it possible to miniaturize the overall dimension in the magnetism detection device 1.

2. Modification Examples 2.1 First Modification Example

[Configuration of Magnetism Detection Device 1A]

Figure 5:
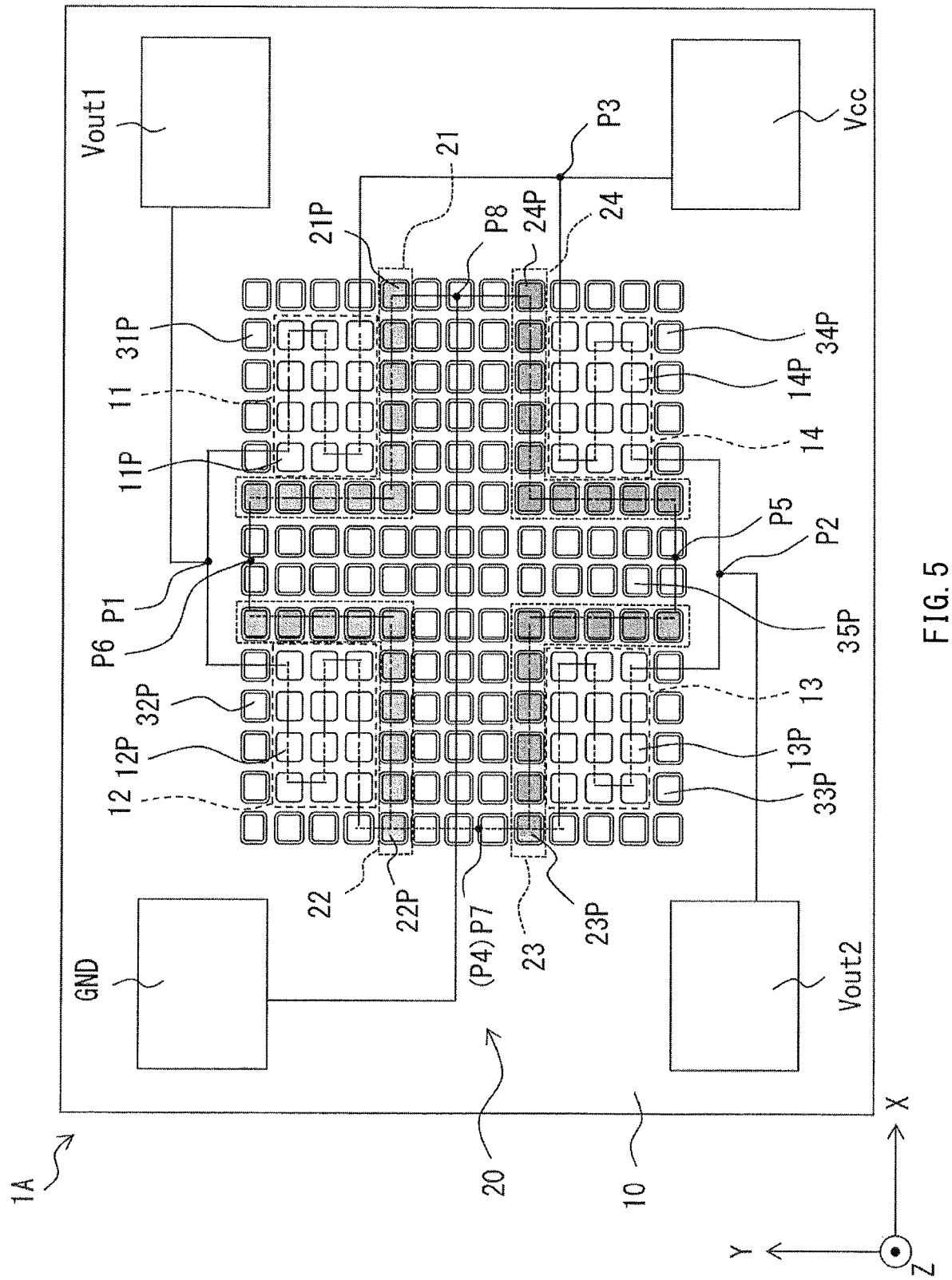
FIG. 5 is a plan view of an overall configuration of a magnetism detection device according to a first modification example of the disclosure.

FIG. 5 is a plan view of an overall configuration example of a magnetism detection device 1A according to a first modification example of the disclosure. The magnetism detection device 1 according to the foregoing embodiment is designed to include the resistive elements 21 to 24 to occupy a part of the gap among the four magnetism detection elements 11 to 14. In contrast, the magnetism detection device 1A according to the present modification example is designed to include a plurality of dummy patterns 35P over multiple rows and multiple columns to fill up a gap among the four magnetism detection elements 11 to 14. The plurality of dummy patterns 35P may have the same stacked structure as that in any of the plurality of first to fourth sensor patterns 11P to 14P. The magnetism detection device 1A may have substantially the same configuration as that of the magnetism detection device 1 except for this point. Here, the plurality of dummy patterns 35P may have the same shape and the same dimension as one another.

[Workings and Effects of Magnetism Detection Device 1A]

As described above, the magnetism detection device 1A is designed to include the plurality of dummy patterns 35P to fill up the gap among the plurality of first to fourth sensor patterns 11P to 14P in the XY plane. Accordingly, it is possible to mitigate occurrence of dishing when performing a planarization process for surfaces including an upper surface of each of the plurality of first to fourth sensor patterns 11P to 14P. As a result, it is possible to suppress dispersion of thickness of each of the plurality of first to fourth sensor patterns 11P to 14P, and this makes it possible to expect improvement of detection accuracy of a magnetic field in the magnetism detection device 1A.

2.2 Second Modification Example

[Configuration of Magnetism Detection Device 1B]

Figure 6:
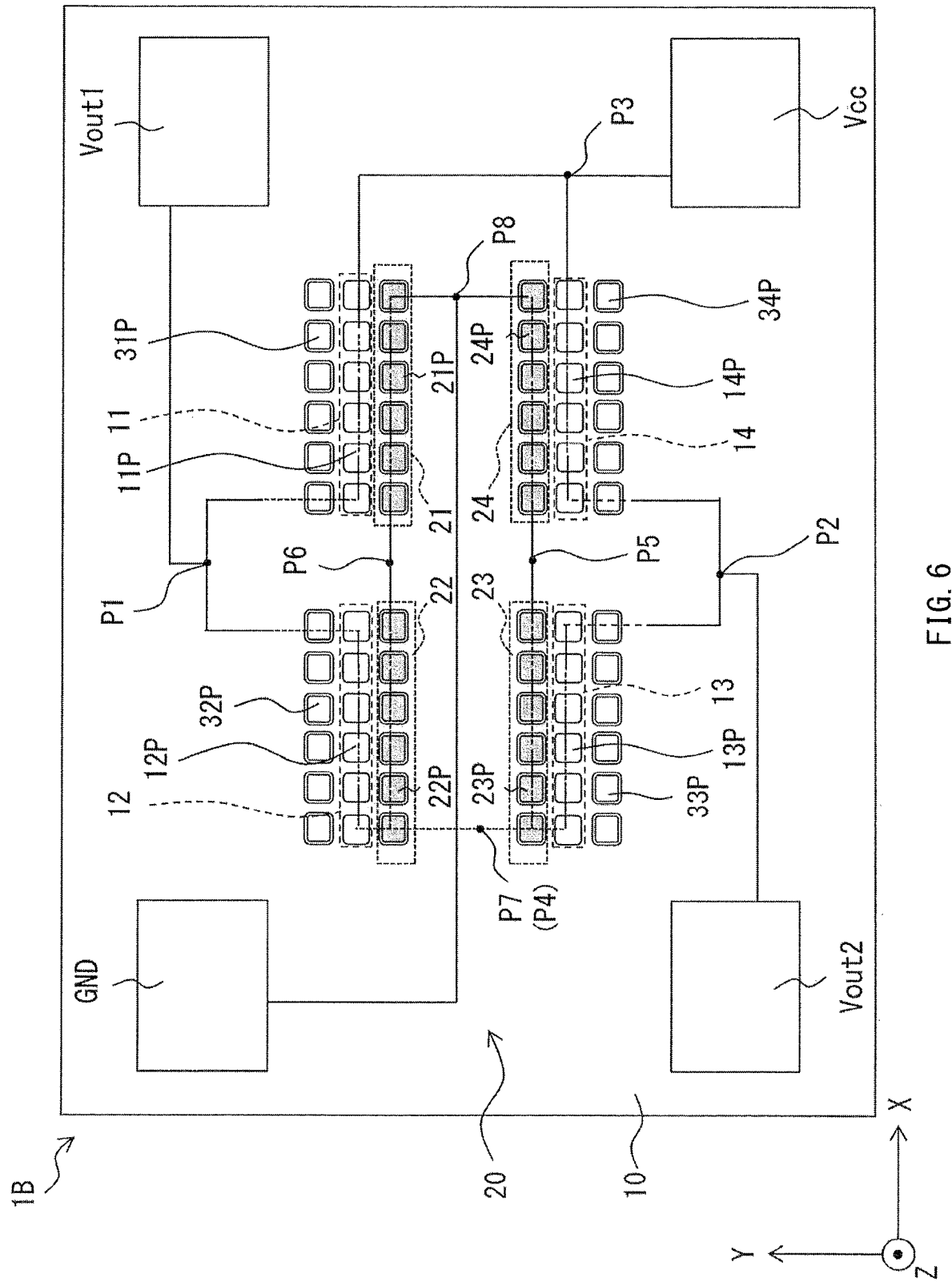
FIG. 6 is a plan view of an overall configuration of a magnetism detection device according to a second modification example of the disclosure.

FIG. 6 is a plan view of an overall configuration example of a magnetism detection device 1B according to a second modification example of the disclosure. The magnetism detection device 1 according to the foregoing embodiment is designed to allow each of the first to fourth sensor patterns 11P to 14P in the magnetism detection elements 11 to 14 to be arranged in matrix. Further, the magnetism detection device 1 according to the foregoing embodiment is also designed to allow the first to fourth resistance patterns 21P to 24P in the resistive elements 21 to 24 to be arranged to enclose a part of the corresponding first to fourth sensor patterns 11P to 14P. In contrast, the magnetism detection device 1B according to the second modification example is designed to allow the first to fourth resistance patterns 21P to 24P, the first to fourth sensor patterns 11P to 14P, and the first to fourth dummy patterns 31P to 34P to be arranged in order in the Y-axis direction. Six of each of the first to fourth resistance patterns 21P to 24P may be arranged in the X-axis direction. Six of each of the first to fourth sensor patterns 11P to 14P may be arranged in the X-axis direction. Six of each of the first to fourth dummy patterns 31P to 34P may be arranged in the X-axis direction. In this manner, in one embodiment of the disclosure, the first to fourth resistance patterns 21P to 24P and the first to fourth dummy patterns 31P to 34P may be formed to be adjacent to the first to fourth sensor patterns 11P to 14P, respectively.

3. Other Modification Examples

The disclosure has been described hereinabove referring to one embodiment and some modification examples. However, the disclosure is not limited to these embodiment and modification examples, and may be modified in a variety of ways. For example, in the foregoing embodiment and modification examples, the four magnetism detection elements are used as the sensor section to form a full-bridge circuit. However, in one embodiment of the disclosure, for example, two magnetism detection elements may be used to form a half-bridge circuit. Further, the disclosure is not limited to the case where the four resistive elements are used for a bridge circuit as the resistive section. For example, two resistive elements may be used to form a half-bridge circuit. Further, a shape and a dimension of the plurality of sensor patterns, a shape and a dimension of the plurality of resistance patterns, and a shape and a dimension of the plurality of dummy patterns may be the same as one another, or may be different from one another.

Further, in the foregoing embodiment and modification examples, the sensor section and the resistive section have two types of stacked structures, that is, the first stacked structure and the second stacked structure in common. However, in one embodiment of the disclosure, the sensor section and the resistive section may have three or more types of stacked structures in common.

Further, description has been given, in the foregoing embodiment and modification examples, of the magnetism detection device to be used as the angle detection sensor section for use in detection of a rotation angle of a rotor. However, application of the magnetism detection device according to an embodiment of the disclosure is not limited thereto. The magnetism detection device according to an embodiment of the disclosure is applicable to an electromagnetic compass for detection of geomagnetism, for example. Further, the sensor may include a detecting element, other than the magneto-resistive effect element, such as a Hall element, for example.

Further, description has been given, in the foregoing embodiment and modification examples, for example, of the case where both the magnetism detection element 11 and the resistive element 21 have the first stacked structure S1 and both the magnetism detection element 12 and the resistive element 22 have the second stacked structure S2. However, the magnetism detection device according to an embodiment of the disclosure is not limited thereto. For example, the magnetism detection device according to a first aspect of the disclosure may have the following configuration. A sensor section may include a first magnetism detection element having a first stacked structure and being able to detect a magnetic field to be detected. A resistive section includes a first resistive element having the first stacked structure, and is coupled to the sensor section. The first stacked structure as used herein means that respective constituent materials of a plurality of layers constituting the stacked structure and stacking order of the plurality of layers are specified. In other words, when comparing the first stacked structure of the first magnetism detection element with the first stacked structure of the first resistive element, the respective constituent materials of the plurality of layers constituting each first stacked structure may correspond with one another, and the stacking order of the plurality of layers constituting each first stacked structure may correspond with each other.

The magnetism detection device according to a second aspect of the disclosure may have the following configuration. A sensor section includes a first magnetism detection element including a first magnetic body that has first magnetization pinned in a first direction and being able to detect a magnetic field to be detected. A resistive section includes a first resistive element including a second magnetic body having second magnetization pinned in the first direction, and is coupled to the sensor section. In other words, all of constituent materials in the first magnetism detection element may correspond with all of constituent materials in the first resistive element; a part of the constituent materials in the first magnetism detection element may be different from a part of the constituent materials in the first resistive element; or all of the constituent materials in the first magnetism detection element may be different from all of the constituent materials in the first resistive element. Further, the magnetism detection device according to the second aspect of the disclosure may have the following configuration. The sensor section may further include a second magnetism detection element being able to detect a magnetic field to be detected and including a third magnetic body having third magnetization pinned in a second direction opposite to the first direction. The resistive section may further include a second resistive element including a fourth magnetic body having fourth magnetization pinned in the second direction. A relationship between the second magnetism detection element and the second resistive element are also similar to a relationship between the first magnetism detection element and the first resistive element as described above.

Moreover, the disclosure encompasses any possible combination of some or all of the various embodiments and the modification examples described herein and incorporated herein.

It is possible to achieve at least the following configurations from the above-described example embodiments of the disclosure.

(1)
A magnetism detection device including:
a sensor section including a first magnetism detection element having a first stacked structure, the first magnetism detection element being configured to detect a magnetic field to be detected; and
a resistive section including a first resistive element having the first stacked structure, the resistive section being coupled to the sensor section.

(2)
The magnetism detection device according to (1), in which each of the first stacked structure in the first magnetism detection element and the first stacked structure in the first resistive element includes a first ferromagnetic layer having first magnetization substantially pinned in a first direction.

(3)
The magnetism detection device according to (1) or (2), in which the resistive section includes a resistor element that adjusts an output voltage regardless of fluctuation in the magnetic field to be detected.

(4)
The magnetism detection device according to any one of (1) to (3), in which the first magnetism detection element and the first resistive element are provided on same substrate.

(5)
The magnetism detection device according to (4), in which
the first magnetism detection element includes a plurality of first sensor patterns arranged on the substrate, each of the plurality of first sensor patterns having the first stacked structure, and
the first resistive element includes a plurality of first resistance patterns arranged on the substrate, each of the plurality of first resistance patterns having the first stacked structure.

(6)
The magnetism detection device according to (5), in which the plurality of first resistance patterns are provided to be adjacent to the plurality of first sensor patterns.

(7)
The magnetism detection device according to (5) or (6), in which the plurality of first resistance patterns are arranged to enclose at least a part of the plurality of first sensor patterns.

(8)
The magnetism detection device according to any one of (5) to (7), further including a plurality of first dummy patterns arranged on the substrate, each of the plurality of first dummy patterns having the first stacked structure, in which
at least a part of the plurality of first dummy patterns constitutes the plurality of first resistance patterns.

(9)
The magnetism detection device according to (8), in which the plurality of first dummy patterns are provided to be adjacent to the plurality of first sensor patterns.

(10)
The magnetism detection device according to (8) or (9), in which the plurality of first dummy patterns are arranged to enclose at least a part of the plurality of first sensor patterns.

(11)
The magnetism detection device according to (1), in which
the sensor section further includes a second magnetism detection element having a second stacked structure, the second magnetism detection element being configured to detect the magnetic field to be detected, and
the resistive section further includes a second resistive element having the second stacked structure.

(12)
The magnetism detection device according to (11), in which
each of the first stacked structure in the first magnetism detection element and the first stacked structure in the first resistive element includes a first ferromagnetic layer having first magnetization substantially pinned in a first direction, and
each of the second stacked structure in the second magnetism detection element and the second stacked structure in the second resistive element includes a second ferromagnetic layer having second magnetization substantially pinned in a second direction opposite to the first direction.

(13)
The magnetism detection device according to (11) or (12), in which the resistive section includes a resistor element that adjusts an output voltage regardless of fluctuation in the magnetic field to be detected.

(14)
The magnetism detection device according to any one of (11) to (13), in which the first magnetism detection element, the second magnetism detection element, the first resistive element, and the second resistive element are provided on same substrate.

(15)
The magnetism detection device according to (14), in which
the first magnetism detection element includes a plurality of first sensor patterns arranged on the substrate, each of the plurality of first sensor patterns having the first stacked structure,
the first resistive element includes a plurality of first resistance patterns arranged on the substrate, each of the plurality of first resistance patterns having the first stacked structure, the second magnetism detection element includes a plurality of second sensor patterns arranged on the substrate, each of the plurality of second sensor patterns having the second stacked structure, and
the second resistive element includes a plurality of second resistance patterns arranged on the substrate, each of the plurality of second resistance patterns having the second stacked structure.

(16)
The magnetism detection device according to (15), in which
the plurality of first resistance patterns are provided to be adjacent to the plurality of first sensor patterns, and
the plurality of second resistance patterns are provided to be adjacent to the plurality of second sensor patterns.

(17)
The magnetism detection device according to (15) or (16), in which
the plurality of first resistance patterns are arranged to enclose at least a part of the plurality of first sensor patterns, and
the plurality of second resistance patterns are arranged to enclose at least a part of the plurality of second sensor patterns.

(18)
The magnetism detection device according to any one of (15) to (17), further including:
a plurality of first dummy patterns arranged on the substrate, each of the plurality of first dummy patterns having the first stacked structure; and
a plurality of second dummy patterns arranged on the substrate, each of the plurality of second dummy patterns having the second stacked structure, in which
at least a part of the plurality of first dummy patterns constitutes the plurality of first resistance patterns, and
at least a part of the plurality of second dummy patterns constitutes the plurality of second resistance patterns.

(19)
The magnetism detection device according to (18), in which
the plurality of first dummy patterns are provided to be adjacent to the plurality of first sensor patterns, and
the plurality of second dummy patterns are provided to be adjacent to the plurality of second sensor patterns.

(20)
The magnetism detection device according to (18) or (19), in which
the plurality of first dummy patterns are arranged to enclose at least a part of the plurality of first sensor patterns, and
the plurality of second dummy patterns are arranged to enclose at least a part of the plurality of second sensor patterns.

(21)
The magnetism detection device according to any one of (11) to (20), in which
the first magnetism detection element and the second magnetism detection element in the sensor section are coupled in series or coupled in parallel to each other,
the first resistive element and the second resistive element in the resistive section are coupled in series or coupled in parallel to each other, and
the sensor section and the resistive section are coupled in series to each other.

(22)
The magnetism detection device according to any one of (11) to (21), in which the first resistive element and the second resistive element in the resistive section are provided between the first magnetism detection element in the sensor section and the second magnetism detection element in the sensor section.

(23)
The magnetism detection device according to any one of (11) to (22), in which each of the first magnetism detection element, the second magnetism detection element, the first resistive element, and the second resistive element includes a magnetic tunnel junction element.

(24)
The magnetism detection device according to (1), in which
the sensor section further includes
a second magnetism detection element having a second stacked structure and being configured to detect the magnetic field to be detected,
a third magnetism detection element having the first stacked structure and being configured to detect the magnetic field to be detected, and
a fourth magnetism detection element having the second stacked structure and being configured to detect the magnetic field to be detected, and
the resistive section further includes
a second resistive element having the second stacked structure,
a third resistive element having the first stacked structure, and
a fourth resistive element having the second stacked structure.

(25)
The magnetism detection device according to (24), in which
the first stacked structure includes a plurality of first stacked structures,
each of the first stacked structures includes a first ferromagnetic layer having first magnetization substantially pinned in a first direction, and
the second stacked structure includes a plurality of second stacked structures,
each of the second stacked structures includes a second ferromagnetic layer having second magnetization substantially pinned in a second direction opposite to the first direction.

(26)
The magnetism detection device according to (24) or (25), in which
the sensor section includes a first bridge circuit in which the first magnetism detection element and the second magnetism detection element coupled in series and the third magnetism detection element and the fourth magnetism detection element coupled in series are coupled in parallel to each other, and
the resistive section includes a second bridge circuit in which the first resistive element and the second resistive element coupled in series and the third resistive element and the fourth resistive element coupled in series are coupled in parallel to each other.

(27)
A magnetism detection device including:
a sensor section including a first magnetism detection element including a first magnetic body having first magnetization pinned in a first direction, the first magnetism detection element being configured to detect a magnetic field to be detected; and
a resistive section including a first resistive element, the first resistive element including a second magnetic body having second magnetization pinned in the first direction, the resistive section coupled to the sensor section.

(28) The magnetism detection device according to (27), in which the sensor section further includes a second magnetism detection element including a third magnetic body having third magnetization pinned in a second direction opposite to the first direction, the second magnetism detection element being configured to detect the magnetic field to be detected, and the resistive section further includes a second resistive element, the second resistive element including a fourth magnetic body having fourth magnetization pinned in the second direction.

According to the magnetism detection device of an embodiment of the disclosure, a structure that is able to be manufactured by simpler processes is provided.

Although the disclosure has been described in terms of exemplary embodiment and modification examples, it is not limited thereto. It should be appreciated that variations may be made in the described embodiment and modification examples by a person having ordinary skill in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. The term "substantially" and its variations are defined as being largely but not necessarily wholly what is specified as understood by a person having ordinary skill in the art. Moreover, no element or component in this disclosure is intended to be dedicated to the public regardless of whether the element or component is explicitly recited in the following claims.

What is claimed is:

1. A magnetism detection device comprising:
a sensor section including a first magnetism detection element having a first stacking configuration, the first magnetism detection element being configured to detect a magnetic field to be detected; and
a resistive section including a first resistive element having the first stacking configuration, the resistive section being coupled to the sensor section,
wherein the first stacking configuration includes a first ferromagnetic layer having a pinned first magnetization direction.

2. The magnetism detection device according to claim 1, wherein
the sensor section further includes
a second magnetism detection element having a second stacking configuration and being configured to detect the magnetic field to be detected,
a third magnetism detection element having the first stacking configuration and being configured to detect the magnetic field to be detected, and
a fourth magnetism detection element having the second stacking configuration and being configured to detect the magnetic field to be detected, and
the resistive section further includes
a second resistive element having the second stacking configuration,
a third resistive element having the first stacking configuration, and
a fourth resistive element having the second stacking configuration.

3. The magnetism detection device according to claim 1, wherein the resistive section comprises a resistor element that adjusts an output voltage regardless of fluctuation in the magnetic field to be detected.

4. The magnetism detection device according to claim 1, wherein the first magnetism detection element and the first resistive element are on a same substrate.

5. The magnetism detection device according to claim 4, wherein
the first magnetism detection element includes a plurality of first sensor patterns arranged on the substrate, each of the plurality of first sensor patterns having the first stacking configuration, and
the first resistive element includes a plurality of first resistance patterns arranged on the substrate, each of the plurality of first resistance patterns having the first stacking configuration.

6. The magnetism detection device according to claim 5, wherein the plurality of first resistance patterns are adjacent to the plurality of first sensor patterns.

7. The magnetism detection device according to claim 5, wherein the plurality of first resistance patterns enclose at least a part of the plurality of first sensor patterns.

8. The magnetism detection device according to claim 5, further comprising a plurality of first dummy patterns arranged on the substrate, each of the plurality of first dummy patterns having the first stacking configuration, wherein
at least a part of the plurality of first dummy patterns constitutes the plurality of first resistance patterns.

9. The magnetism detection device according to claim 8, wherein the plurality of first dummy patterns are adjacent to the plurality of first sensor patterns.

10. The magnetism detection device according to claim 8, wherein the plurality of first dummy patterns enclose at least a part of the plurality of first sensor patterns.

11. The magnetism detection device according to claim 1, wherein
the sensor section further includes a second magnetism detection element having a second stacking configuration, the second magnetism detection element being configured to detect the magnetic field to be detected, and
the resistive section further includes a second resistive element having the second stacking configuration.

12. The magnetism detection device according to claim 11, wherein
the second stacking configuration includes a second ferromagnetic layer having a pinned second magnetization direction opposite to the pinned first magnetization direction.

13. The magnetism detection device according to claim 11, wherein the resistive section comprises a resistor element that adjusts an output voltage regardless of fluctuation in the magnetic field to be detected.

14. The magnetism detection device according to claim 11, wherein the first magnetism detection element, the second magnetism detection element, the first resistive element, and the second resistive element are on a same substrate.

15. The magnetism detection device according to claim 14, wherein the first magnetism detection element includes a plurality of first sensor patterns arranged on the substrate, each of the plurality of first sensor patterns having the first stacking configuration, the first resistive element includes a plurality of first resistance patterns arranged on the substrate, each of the plurality of first resistance patterns having the first stacking configuration, the second magnetism detection element includes a plurality of second sensor patterns arranged on the substrate, each of the plurality of second sensor patterns having the second stacking configuration, and the second resistive element includes a plurality of second resistance patterns arranged on the substrate, each of the plurality of second resistance patterns having the second stacking configuration.

16. The magnetism detection device according to claim 15, wherein the plurality of first resistance patterns are adjacent to the plurality of first sensor patterns, and the plurality of second resistance patterns are adjacent to the plurality of second sensor patterns.

17. The magnetism detection device according to claim 15, wherein the plurality of first resistance patterns enclose at least a part of the plurality of first sensor patterns, and the plurality of second resistance patterns enclose at least a part of the plurality of second sensor patterns.

18. The magnetism detection device according to claim 15, further comprising:

a plurality of first dummy patterns arranged on the substrate, each of the plurality of first dummy patterns having the first stacking configuration; and a plurality of second dummy patterns arranged on the substrate, each of the plurality of second dummy patterns having the second stacking configuration, wherein at least a part of the plurality of first dummy patterns constitutes the plurality of first resistance patterns, and at least a part of the plurality of second dummy patterns constitutes the plurality of second resistance patterns.

19. The magnetism detection device according to claim 18, wherein the plurality of first dummy patterns are adjacent to the plurality of first sensor patterns, and the plurality of second dummy patterns are adjacent to the plurality of second sensor patterns.

20. The magnetism detection device according to claim 18, wherein the plurality of first dummy patterns enclose at least a part of the plurality of first sensor patterns, and the plurality of second dummy patterns enclose at least a part of the plurality of second sensor patterns.

21. The magnetism detection device according to claim 11, wherein the first magnetism detection element and the second magnetism detection element in the sensor section are coupled in series or coupled in parallel to each other, the first resistive element and the second resistive element in the resistive section are coupled in series or coupled in parallel to each other, and the sensor section and the resistive section are coupled in series to each other.

22. The magnetism detection device according to claim 11, wherein the first resistive element and the second resistive element in the resistive section are between the first magnetism detection element in the sensor section and the second magnetism detection element in the sensor section.

23. The magnetism detection device according to claim 11, wherein each of the first magnetism detection element, the second magnetism detection element, the first resistive element, and the second resistive element comprises a magnetic tunnel junction element.

24. The magnetism detection device according to claim 2, wherein the sensor section includes a first bridge circuit in which the first magnetism detection element and the second magnetism detection element coupled in series and the third magnetism detection element and the fourth magnetism detection element coupled in series are coupled in parallel to each other, and the resistive section includes a second bridge circuit in which the first resistive element and the second resistive element coupled in series and the third resistive element and the fourth resistive element coupled in series are coupled in parallel to each other.

25. The magnetism detection device according to claim 2, wherein the second stacking configuration includes a second ferromagnetic layer having a pinned second magnetization direction opposite to the pinned first magnetization direction.

26. A magnetism detection device comprising:

a sensor section including a first magnetism detection element including a first magnetic body having a pinned first magnetization direction, the first magnetism detection element being configured to detect a magnetic field to be detected; and a resistive section including a first resistive element, the first resistive element including a second magnetic body having the pinned first magnetization direction, the resistive section being coupled to the sensor section.

27. The magnetism detection device according to claim 26, wherein the sensor section further includes a second magnetism detection element including a third magnetic body having a pinned second magnetization direction opposite to the pinned first magnetization direction, the second magnetism detection element being configured to detect the magnetic field to be detected, and the resistive section further includes a second resistive element, the second resistive element including a fourth magnetic body having the pinned second magnetization direction.

* * * * *